United States Patent
Wu et al.

(10) Patent No.: US 11,189,725 B2
(45) Date of Patent: Nov. 30, 2021

(54) VTFET WITH CELL HEIGHT CONSTRAINTS

(71) Applicant: INTERNATIONAL BUSINESS MACHINES CORPORATION, Armonk, NY (US)

(72) Inventors: Heng Wu, Guilderland, NY (US); Ruilong Xie, Niskayuna, NY (US); Lan Yu, Voorheesville, NY (US); Alexander Reznicek, Troy, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 10 days.

(21) Appl. No.: 16/735,788

(22) Filed: Jan. 7, 2020

(65) Prior Publication Data

US 2021/0210633 A1    Jul. 8, 2021

(51) Int. Cl.
*H01L 21/8234* (2006.01)
*H01L 29/78* (2006.01)
*H01L 29/66* (2006.01)
*H01L 29/08* (2006.01)

(52) U.S. Cl.
CPC ...... *H01L 29/7827* (2013.01); *H01L 29/0847* (2013.01); *H01L 29/6656* (2013.01); *H01L 29/66666* (2013.01)

(58) Field of Classification Search
CPC .......... H01L 29/66666; H01L 29/7827; H01L 21/823487
See application file for complete search history.

(56) References Cited

U.S. PATENT DOCUMENTS

| | | | |
|---|---|---|---|
| 6,878,990 B2 | 4/2005 | Yoo | |
| 8,890,241 B2 * | 11/2014 | Takaishi | H01L 29/7802 257/331 |
| 9,773,708 B1 | 9/2017 | Zhang et al. | |
| 9,799,777 B1 | 10/2017 | Balakrishnan et al. | |
| 10,243,073 B2 | 3/2019 | Anderson et al. | |
| 10,461,186 B1 * | 10/2019 | Zhang | H01L 29/66666 |
| 2018/0053844 A1 | 2/2018 | Bi et al. | |
| 2019/0140052 A1 | 5/2019 | Cheng et al. | |

* cited by examiner

*Primary Examiner* — Mark V Prenty
(74) *Attorney, Agent, or Firm* — Tutunjian & Bitetto, P.C.; Jeffrey S. LaBaw

(57) ABSTRACT

Semiconductor devices and methods of forming the same include forming a restraint structure over a channel fin, having an opening that is smaller than a top surface of the channel fin. A top semiconductor structure is grown from the top surface of the channel fin, with lateral growth of the semiconductor structure being limited by the restraint structure.

18 Claims, 4 Drawing Sheets

US 11,189,725 B2

VTFET WITH CELL HEIGHT CONSTRAINTS

BACKGROUND

The present invention generally relates to semiconductor device fabrication and, more particularly, to the fabrication of vertical transport field effect transistors (VTFETs) with tight cell height constraints that have top low source/drain junction resistance.

VTFETs provide good scaling in chip area by establishing a vertical orientation, with the source and drain regions being positioned vertically around the channel. However, as devices continue to scale smaller in size, constraints are imposed due to the risk of nearby structures, such as the gate and bottom source/drain contacts, shorting to the top source/drain. Shrinking the top source/drain relative to the width of the channel fin results in substantially increased junction resistance, degrading device performance.

SUMMARY

A method of forming a semiconductor device includes forming a restraint structure over a channel fin, having an opening that is smaller than a top surface of the channel fin. A top semiconductor structure is grown from the top surface of the channel fin, with lateral growth of the semiconductor structure being limited by the restraint structure.

A method of forming a semiconductor device includes forming a channel fin on a bottom source/drain structure. A gate stack is formed on sidewalls of the channel fin. A sacrificial layer is formed on a top surface of a channel fin. A restraint structure is formed on the sacrificial layer, the restraint structure having an opening that is smaller than the top surface of the channel fin. The sacrificial layer is etched away to expose the top surface of the channel fin. A top source/drain structure is grown from the top surface of the channel fin, with lateral growth of the semiconductor structure being limited by the restraint structure.

A semiconductor device includes a channel fin having a top surface. A top semiconductor structure is formed in contact with the entire top surface of the channel fin and has a top portion and a bottom portion. The top portion of the top semiconductor structure is narrower than the bottom portion. A restraint structure is formed over the bottom portion of the semiconductor structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide vertical transport field effect transistors (VTFETs) that include epitaxially grown top source/drain contacts that are laterally constrained at their top surfaces, resulting in a structure that is narrower at the top than at the bottom. This preserves the contact area between the top source/drain structure and the channel fin, while still meeting cell height constraints.

As used herein, the term "cell height constraint" refers to a design layout constraint that limits how closely one structure can be positioned relative to neighboring structures. The cell height constraint thereby prevents conductive structures from shorting to one another as a result of normal fabrication process variations. Some structures, such as anisotropically etched contact vias, tend to taper as they travel through a layer, with a wider diameter at their top surface than at their bottom surface. By forming a VTFET with a top source/drain that has a smaller dimension at its top surface than at its bottom surface, a complementary shape can be formed that maximizes contact area without risking damage.

Figure 1:
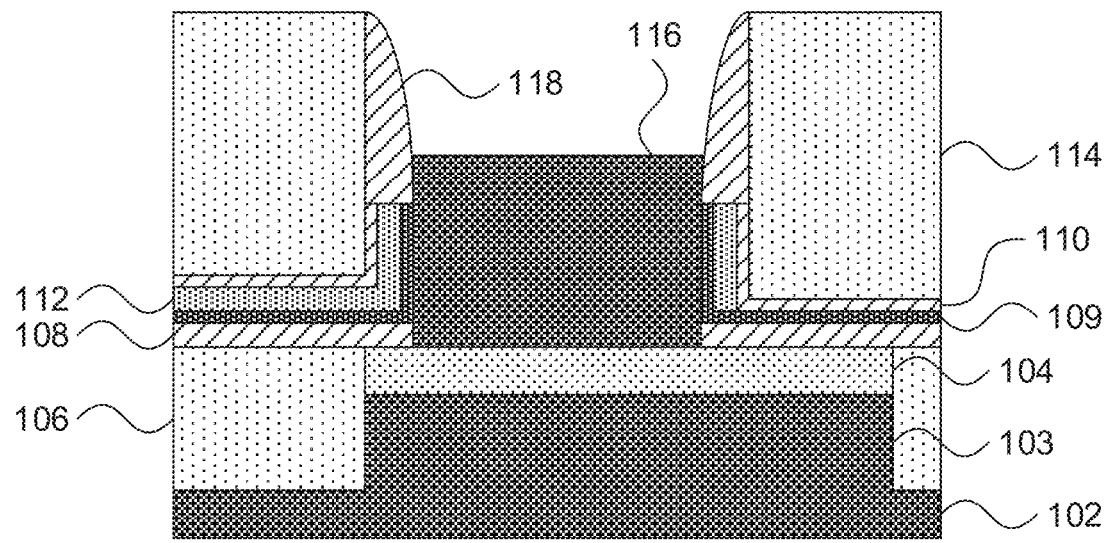
FIG. 1 is a cross-sectional view of a step in the formation of a vertical transport field effect transistor (VTFET) that shows a channel fin being formed over a bottom source/drain structure, in accordance with an embodiment of the present invention.

Referring now to FIG. 1, a cross-sectional view of a step in the fabrication of a VTFET is shown. This step is shown in the middle of a larger process, with a number of the elements of the VTFET already in place. It should be understood that the processes described herein are provided for the purpose of illustration and should not be construed as limiting. Similarly, the structures described herein are intended to put the embodiments of the present invention in an understandable context and should not be construed as limiting.

A platform 103 can be formed from a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

A platform 103 can be formed from the semiconductor substrate 102 by any appropriate anisotropic etching technique. For example, reactive ion etching (RIE) is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the platform 103 can be formed by spacer imaging transfer.

A bottom source/drain structure 104 is formed on top of the platform 103. In some embodiments, the bottom source/drain structure can be epitaxially grown from the top surface of the platform 103. The bottom source/drain structure 104 is formed from a doped semiconductor material, for example including n-type dopants or p-type dopants, and can be doped in situ during the epitaxial growth or through ion implantation.

A first interlayer dielectric 106 is formed around the platform 103 and the bottom source/drain structure 104. The first interlayer dielectric 106 can be formed by any appropriate dielectric material with appropriate etch selectivity, such as silicon dioxide. The dielectric material can be deposited by any appropriate deposition process, such as, e.g., chemical vapor deposition (CVD), physical vapor deposition (PVD), atomic layer deposition (ALD), or gas cluster ion beam (GCIB) deposition. In some embodiments, the dielectric material can be deposited by a flowable CVD process. After deposition, excess material can be removed using chemical mechanical planarization (CMP).

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

CMP is performed using, e.g., a chemical or granular slurry and mechanical force to gradually remove upper layers of the device. The slurry may be formulated to be unable to dissolve, for example, the source/drain material, resulting in the CMP process's inability to proceed any farther than that layer.

A fin 116 is also formed on the platform 103. The fin 116 can be formed by etching down into the same semiconductor layer that forms the platform 103, with the bottom source/drain structure 104 being grown or implanted around the fin 116. Thus, in some embodiments, the fin 116 penetrates through the bottom source/drain structure 104. The fin 116 is formed from an appropriate channel material, such as silicon.

A bottom spacer 108 is formed around the fin 116, on the first interlayer dielectric 106 and the bottom source/drain structure 104. It is specifically contemplated that the bottom spacer can be formed from silicon nitride, silicon carbide, or silicon oxycarbide, but it should be understood that any appropriate dielectric material can be used instead.

A gate dielectric layer 109 is formed on sidewalls of the channel fin 116 by any appropriate conformal process. It is specifically contemplated that the gate dielectric layer 109 can be formed from a high-k dielectric material, but it should be understood that any appropriate dielectric material can be used instead. As used herein, the term "high-k" refers to materials that have a dielectric constant k that is greater than that of silicon dioxide. Examples of high-k dielectric materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum. An interfacial layer may exist between the gate dielectric and channel material, to passivate the interface between the channel material and the gate dielectric, for improving carrier transport.

A gate conductor layer 112 is formed over the gate dielectric layer 109. The gate conductor layer 112 can be formed by any appropriate conformal deposition process and can be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor layer 112 may alternatively be formed from a doped semiconductor material such as, e.g., doped polysilicon. In some embodiments, the gate conductor layer 112 can be formed with a work function metal, or can include multiple conductor layers, with a work function metal layer in contact with the channel fin 116.

As shown in FIG. 1, the gate conductor layer 112 can be formed around the fin 116, to provide a large contact area. Notably, the gate conductor layer 112 extends laterally on one side of the fin 116, and not on the other. This provides a surface for a gate contact on one side, without interfering with the bottom source/drain contact.

A dielectric cap layer 110 is formed on and around the gate conductor layer 112 to electrically isolate the gate conductor layer 112 from neighboring structures. The dielectric cap layer 110 can be formed from any appropriate dielectric material such as, e.g., silicon nitride, and by any appropriate conformal deposition process.

A second interlayer dielectric 114 is formed over and around the fin 116 and the dielectric cap layer 110. The second interlayer dielectric 114 can be formed by any appropriate process, such as a flowable CVD process, and can be formed from any appropriate dielectric material, such as silicon dioxide. CMP can be used to bring the top surface of the second interlayer dielectric 114 to a first fin height.

In some embodiments, the fin 116 can then be etched down, below the height of the second interlayer dielectric, using any appropriately selective isotropic or anisotropic etch. Similarly, the dielectric cap layer 110, the gate contact layer 112, and the gate dielectric layer 109 can be etched down, below a new top surface of the fin 116. This leaves a gap between the fin 116 and the second interlayer dielectric 114. The gap can then be filled by conformal deposition of a spacer material, such as silicon nitride. The spacer material is anisotropically etched to remove it from horizontal surfaces, forming top spacers 118. The resulting structure includes an exposed top surface of the fin 116.

Figure 2:
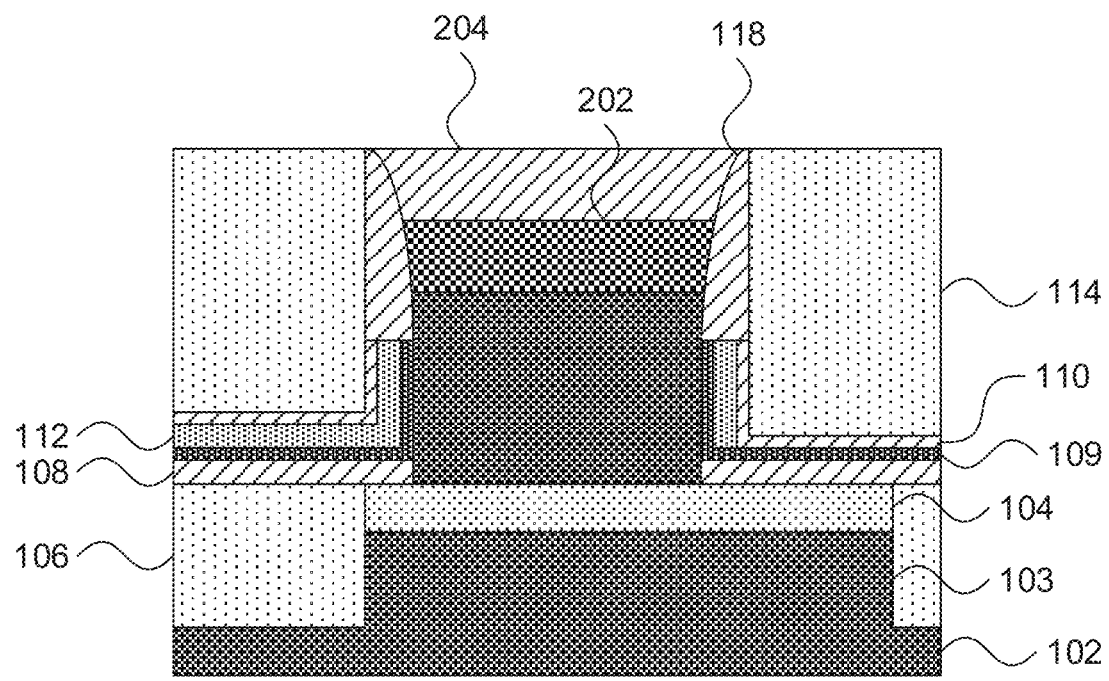
FIG. 2 is a cross-sectional view of a step in the formation of a VTFET that shows the formation of a sacrificial layer and a cap layer being formed over the channel fin, in accordance with an embodiment of the present invention.

Referring now to FIG. 2, a cross-sectional view of a step in the fabrication of a VTFET is shown. A sacrificial semiconductor layer 202 is formed on top of the channel fin 116. In some embodiments, the sacrificial semiconductor layer 202 can be formed by an epitaxial growth process and can be formed from silicon germanium, but it should be understood that any appropriate semiconductor, having etch selectivity and a compatible crystal structure with the material of the underlying fin, can be used instead to form the sacrificial semiconductor layer 202. The sacrificial semiconductor layer 202 covers the entire active surface of the channel fin 116 and protects the top spacers 118 from subsequent patterning steps. As used herein, the term "selective," in reference to a material removal process, denotes that the rate of material removal for a first material is greater than the rate of removal for at least another material of the structure to which the material removal process is being applied.

A cap layer 204 is formed over the sacrificial semiconductor layer 202. The cap layer 204 can be formed using any appropriate deposition process and can be formed from any appropriate dielectric material. After deposition of the dielectric material, a CMP can be performed that stops on the second interlayer dielectric 114 or the top spacers 118. In some embodiments, the cap layer 204 can be formed from silicon nitride, silicon carbide, or silicon oxycarbide.

Figure 3:
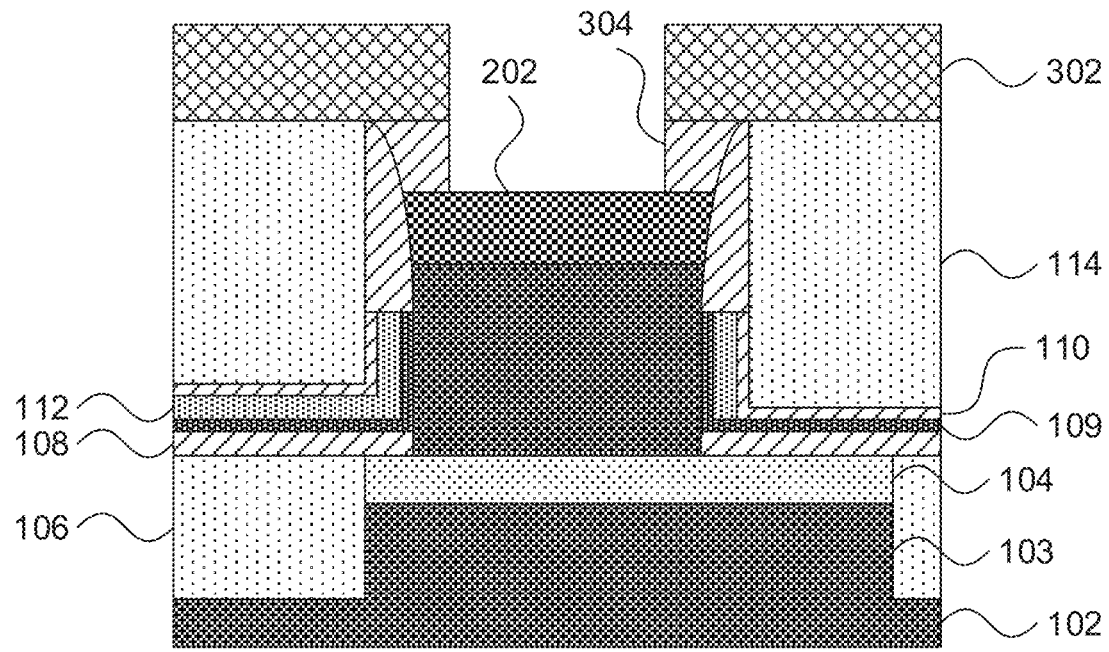
FIG. 3 is a cross-sectional view of a step in the formation of a VTFET that shows the patterning of a hole in the cap layer to expose the sacrificial layer, in accordance with an embodiment of the present invention.

Referring now to FIG. 3, a cross-sectional view of a step in the fabrication of a VTFET is shown. A mask 302 is formed over the top surface of the cap layer 204 by any appropriate deposition process, such as CVD, ALD, PVD, or GCIB deposition. The mask 302 can be formed from, for example, an organic planarizing layer (OPL), and etched using any appropriate photolithographic process. The mask 302 exposes a portion of the underlying cap layer 204, which is then anisotropically etched away to expose the underlying sacrificial semiconductor layer 202. A top restraint structure 304 remains at the sides.

Figure 4:
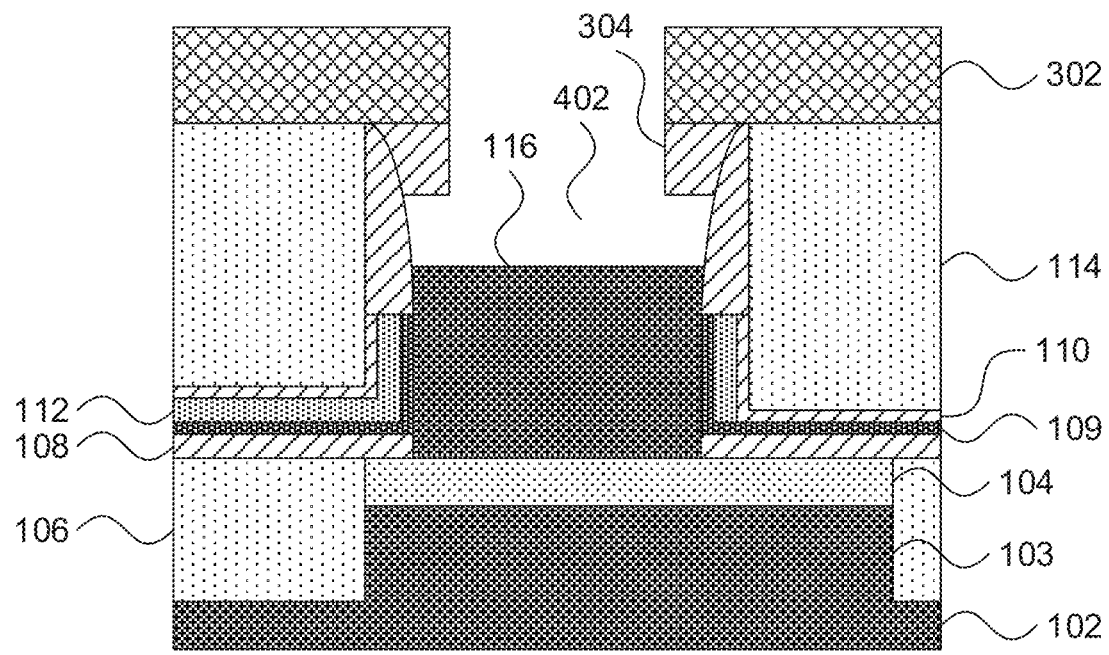
FIG. 4 is a cross-sectional view of a step in the formation of a VTFET that shows the removal of the sacrificial layer to expose the top surface of the channel fin, in accordance with an embodiment of the present invention.

Referring now to FIG. 4, a cross-sectional view of a step in the fabrication of a VTFET is shown. A selective isotropic etch is used to remove the sacrificial layer, without damaging the top restraint structure 304, the top spacers 118, and the fin 116. A space 402 is created, which extends over the entirety of the top surface of the channel fin 116 and that has an opening at the top that is narrower than the top surface of the channel fin 116.

Figure 5:
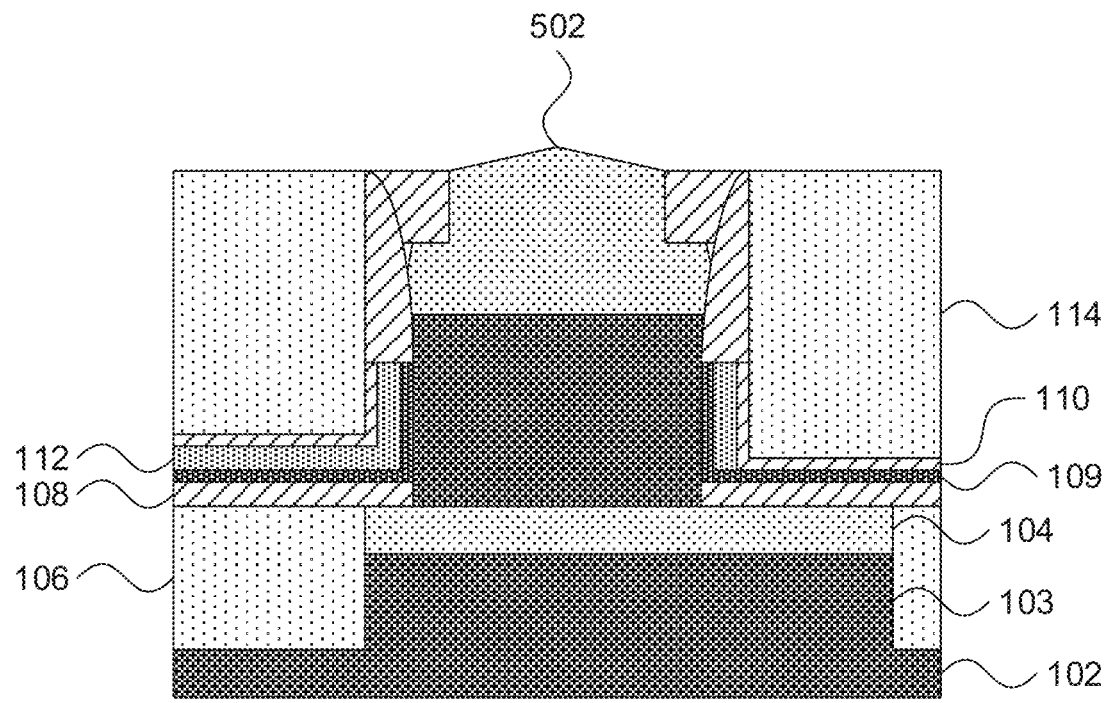
FIG. 5 is a cross-sectional view of a step in the formation of a VTFET that shows the formation of a top source/drain structure on the exposed top surface of the channel fin, in accordance with an embodiment of the present invention.

Referring now to FIG. 5, a cross-sectional view of a step in the fabrication of a VTFET is shown. The OPL 302 can be removed and a top source/drain structure 502 is grown in the space 402, from the top surface of the fin 116. The growth of the top source/drain structure 502 is laterally constrained by the top spacers 118 and the restraint structure 304. As a result, the top source/drain structure 502 has a bottom surface that covers the top surface of the fin 116 and has a top surface that is narrower than the bottom surface.

Figure 6:
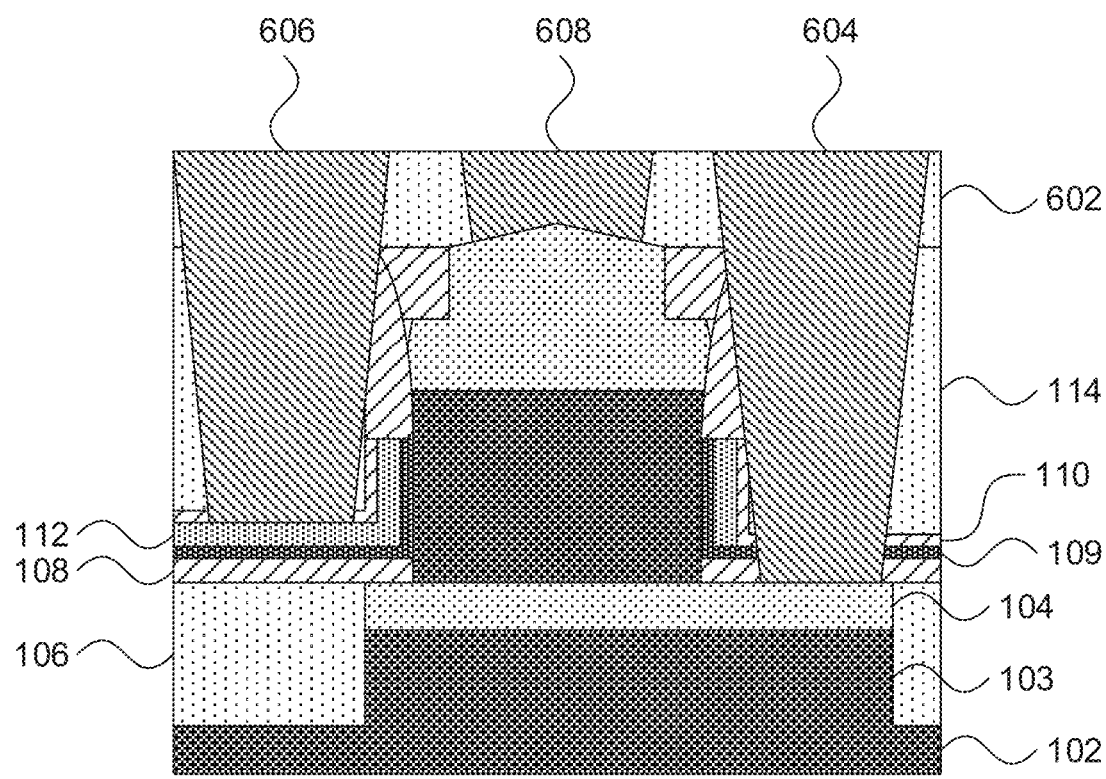
FIG. 6 is a cross-sectional view of a step in the formation of a VTFET that shows the formation electrical contacts to the bottom source/drain structure, a gate stack, and the top source/drain structure, through an interlayer dielectric, in accordance with an embodiment of the present invention.

Referring now to FIG. 6, a cross-sectional view of a step in the fabrication of a VTFET is shown. A third interlayer dielectric 602 is formed over the second interlayer dielectric 114 and the top source/drain structure 502. Vias are formed through the third interlayer dielectric and the second interlayer dielectric to reach respective contact point, and conductive material is deposited in the vias. This forms the bottom source/drain contact 604, which penetrates the gate stack and the bottom spacer 108 to reach the bottom source/drain structure 104, the gate contact 606, which penetrates the dielectric cap layer 110 to contact the gate conductor layer 112 of the gate stack, and the top source/drain contact 608, which penetrates the third interlayer dielectric 602 to contact the top source/drain structure 502.

As is shown in FIG. 6, a portion of the contacts 604 and 606 pass through space that was occupied by the restraint structures 304. If the restraint structures 304 were not present, then the growth of the top source/drain structure 502 could have filled that space. The result would have been an electrical short-circuit between the top source/drain structure 502 and the bottom source/drain contact 604 and/or the gate contact 606. By constraining the lateral growth of the top source/drain structure 502, the restraint structures 304 help improve device yield and help meet cell height constraints in the design layout.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular form "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another elements) or features) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood at yen a layer referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 7:
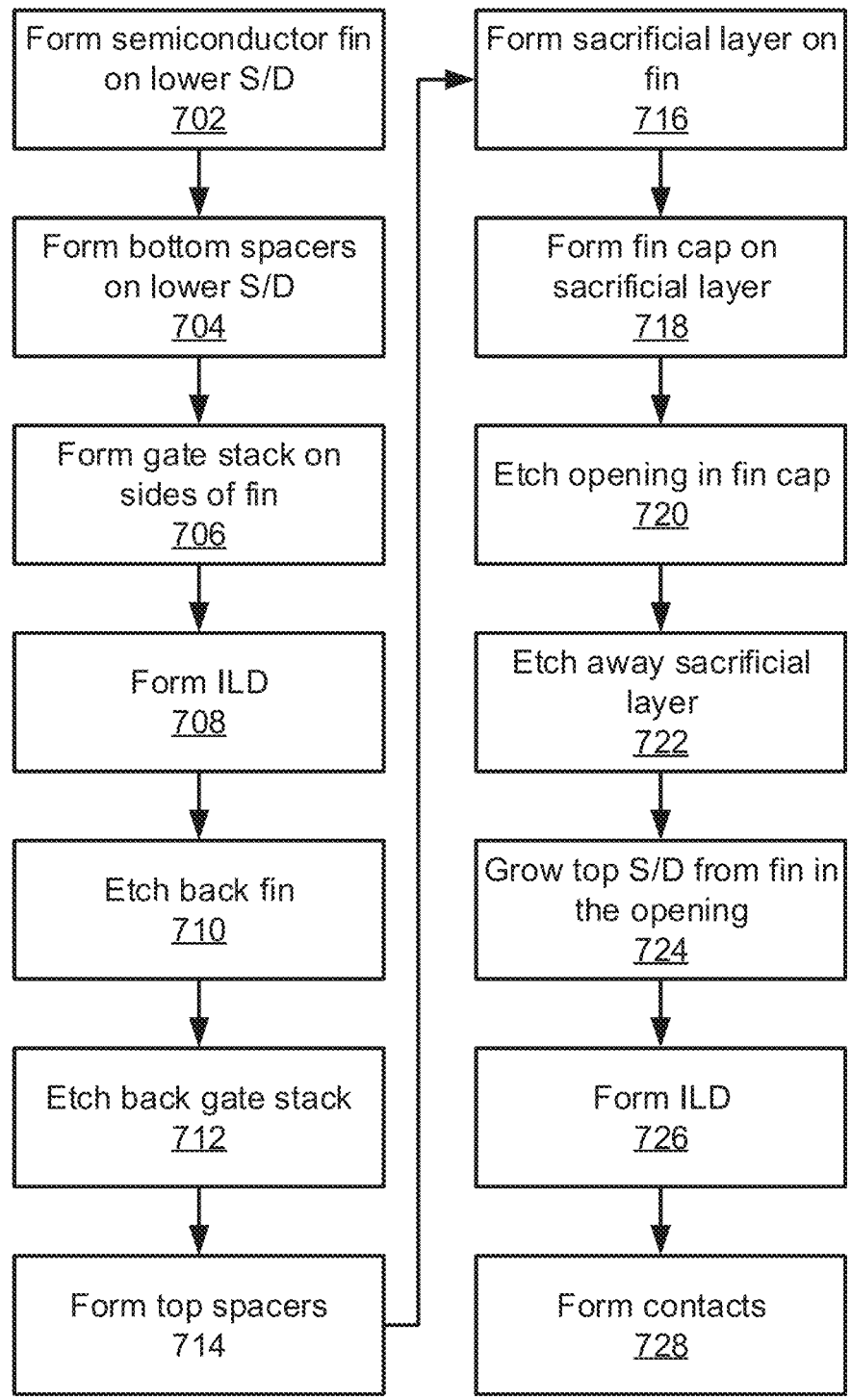
FIG. 7 is a block/flow diagram of a method of forming a VTFET that has a top source/drain structure with a narrowed top portion to meet cell height constraints, in accordance with an embodiment of the present invention.

Referring now to FIG. 7, a method of forming a VTFET with cell height constraints is shown. Block 702 forms a semiconductor fin on a bottom source/drain structure 104. It is specifically contemplated that the semiconductor fin can be formed by epitaxial growth, but it should be understood that any appropriate deposition process can be used. Block 704 forms the bottom spacers 108 on the lower source/drain region 104. In some embodiments, the bottom spacers 108 can be formed first by conformally depositing a layer of dielectric material, followed by etching a hole in the layer and forming the semiconductor fin through the hole.

Block 706 forms the gate stack on the sides of the semiconductor fin. The gate stack can include, for example, a gate dielectric layer, a gate conductor layer, and a gap layer. These layers can be formed by conformal deposition processes. Block 708 then forms an interlayer dielectric 114 around the semiconductor fin and the gate stack.

Block 710 etches back the semiconductor fin to form the channel fin 116. Block 712 etches back the layers of the gate stack below the height of the channel fin 116 to form the gate dielectric 109, gate conductor 112, and cap layer 110. These etches can be performed with respective selective anisotropic etches. Top spacers 118 can then be formed on the exposed sidewalls of the interlayer dielectric 114 using a conformal deposition process, followed by a selective anisotropic etch to remove material from the horizontal surfaces.

Block 716 forms a sacrificial layer 202 on the channel fin 116, for example by epitaxial growth from the exposed top surface of the channel fin 116. The sacrificial layer 202 is formed from a material that has a crystal structure that is compatible with the crystal structure of the channel fin 116, but that is selectively etchable with respect to the material of the channel fin 116. A fin cap 204 is then formed over the sacrificial layer 202, for example with a dielectric material that is deposited using any appropriate deposition process, and then polished down to the top height of interlayer dielectric 114 using CMP.

Block 720 etches an opening in the fin cap 204, for example using an OPL mask 302 and a selective anisotropic etch. This leaves behind the restraint structures 304, with a portion of the sacrificial layer 202 exposed. Block 722 etches away the sacrificial layer 202 using a selective isotropic etch that exposes the top surface of the channel fin 116 and undercuts the restraint structures 304, creating an opening 402.

Block 724 epitaxially grows the top source/drain structure 502 from the channel fin 116, within the opening 402. The growth of the top source/drain structure 502 is laterally constrained by the presence of the restraint structures 304. Block 726 then forms a second interlayer dielectric 602 over the first interlayer dielectric 114 and block 728 forms conductive through the interlayer dielectric 114 and 602 to form electrical contacts to the bottom source/drain 104, the gate conductor 112, and the top source/drain 502.

Having described preferred embodiments of a VTFET with cell height constraints (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming a restraint structure over a channel fin, having an opening that is smaller than a top surface of the channel fin, the restraint structure being separated from the top surface of the channel fin by a vertical distance; and
    growing a top semiconductor structure from the top surface of the channel fin, having a top portion and a bottom portion, with lateral growth of the top semiconductor structure being limited by the restraint structure, and with the top portion being narrower than the bottom portion.

2. The method of claim 1, wherein the top surface of the channel fin is fully exposed, with the top semiconductor structure being grown from the entire area of the top surface of the channel fin.

3. The method of claim 1, further comprising forming a sacrificial layer on the channel fin before forming the restraint structure and etching away the sacrificial layer after forming the restraint structure.

4. The method of claim 1, further comprising forming the channel fin on a bottom source/drain structure, wherein the top semiconductor structure is a top source/drain structure.

5. The method of claim 4, further comprising forming a gate stack on sidewalls of the channel fin.

6. The method of claim 5, further comprising forming conductive contacts that respectively contact the bottom source/drain structure, the gate stack, and the top source/drain structure.

7. The method of claim 6, wherein forming the conductive contacts comprises forming a via that intersects with at least a part of the restraint structure.

8. The method of claim 1, further comprising forming top spacers that extend above the top surface of the channel fin, wherein forming the restraint structure causes the restraint structure to be suspended from the top spacers.

9. A method for forming a semiconductor device, comprising:
    forming a restraint structure over a channel fin, having an opening that is smaller than a top surface of the channel fin, wherein the top surface of the channel fin is fully exposed under the restraint structure; and
    growing a top semiconductor structure from an entire area of the top surface of the channel fin, with lateral growth of the top semiconductor structure being limited by the restraint structure.

10. The method of claim 9, further comprising forming a sacrificial layer on the channel fin before forming the restraint structure and etching away the sacrificial layer after forming the restraint structure.

11. The method of claim 9, further comprising forming the channel fin on a bottom source/drain structure, wherein the top semiconductor structure is a top source/drain structure.

12. The method of claim 11, further comprising forming a gate stack on sidewalls of the channel fin.

13. The method of claim 12, further comprising forming conductive contacts that respectively contact the bottom source/drain structure, the gate stack, and the top source/drain structure.

14. The method of claim 13, wherein forming the conductive contacts comprises forming a via that intersects with at least a part of the restraint structure.

15. The method of claim 9, further comprising forming top spacers that extend above the top surface of the channel fin, wherein forming the restraint structure causes the restraint structure to be suspended from the top spacers.

16. The method of claim 9, wherein growing the top semiconductor structure forms a top semiconductor structure that has a top portion and a bottom portion, with the top portion being narrower than the bottom portion.

17. A method for forming a semiconductor device, comprising:
    forming top spacers that extend above a top surface of a channel fin;
    forming a restraint structure over the channel fin, suspended from the top spacers, having an opening that is smaller than the top surface of the channel fin; and
    growing a top semiconductor structure from the top surface of the channel fin, with lateral growth of the top semiconductor structure being limited by the restraint structure.

18. The method of claim 17, wherein the top semiconductor structure is a top source/drain structure, the method further comprising:
    forming the channel fin on a bottom source/drain structure;
    forming a gate stack on sidewalls of the channel fin;
    forming conductive contacts that respectively contact the bottom source/drain structure, the gate stack, and the top source/drain structure, including forming a conductive via that intersects with at least a part of the restraint structure.

* * * * *